(12) United States Patent
Dijkhoff

(10) Patent No.: US 11,209,787 B2
(45) Date of Patent: Dec. 28, 2021

(54) METHOD AND CONTROL DEVICE FOR CONTROLLING A FIELD DEVICE

(71) Applicant: OMRON Corporation, Kyoto (JP)

(72) Inventor: Arno Dijkhoff, Hoofddorp (NL)

(73) Assignee: OMRON Corporation, Kyoto (JP)

( * ) Notice: Subject to any disclaimer, the term of this patent is extended or adjusted under 35 U.S.C. 154(b) by 220 days.

(21) Appl. No.: 16/477,198

(22) PCT Filed: Nov. 24, 2017

(86) PCT No.: PCT/JP2017/042214
§ 371 (c)(1),
(2) Date: Jul. 11, 2019

(87) PCT Pub. No.: WO2018/154891
PCT Pub. Date: Aug. 30, 2018

(65) Prior Publication Data
US 2020/0183347 A1 Jun. 11, 2020

(30) Foreign Application Priority Data
Feb. 21, 2017 (EP) .................................... 17157222

(51) Int. Cl.
*G05B 15/00* (2006.01)
*G05B 19/042* (2006.01)
(Continued)

(52) U.S. Cl.
CPC ..... *G05B 19/0425* (2013.01); *G05B 19/4185* (2013.01); *G05B 2219/23276* (2013.01);
(Continued)

(58) Field of Classification Search
CPC ........ H04W 4/70; H04L 12/4625; H04L 9/32; H04L 69/18; H04H 20/71; G05B 19/042;
(Continued)

(56) References Cited

U.S. PATENT DOCUMENTS 5,535,338 A * 7/1996 Krause ................ H04L 12/4625
709/222
5,991,308 A * 11/1999 Fuhrmann ........... H03M 13/256
370/395.53
(Continued)

FOREIGN PATENT DOCUMENTS

| CN | 104521198 | 4/2015 |
|---|---|---|
| EP | 2677376 | 12/2013 |
| EP | 2975542 | 1/2016 |

OTHER PUBLICATIONS

"International Search Report (Form PCT/ISA/210) of PCT/JP2017/042214," dated Apr. 6, 2018, pp. 1-4.
(Continued)

*Primary Examiner* — Tuan A Vu

(74) *Attorney, Agent, or Firm* — JCIPRNET

(57) ABSTRACT

A method for controlling a field device coupled to an automation network, in which the field device has an associated tool device selected from a group of predetermined tool devices, includes the steps of: coupling the selected tool device to a control device having a physical port device; choosing a virtual link unit from a group of virtual link units included in the control device as a function of the selected tool device, wherein each of the virtual link units corresponds to one of the predetermined tool devices; and establishing a control link between the chosen control device and the selected tool device being associated to the field device via the physical port device using control data included in the chosen virtual link unit.

16 Claims, 6 Drawing Sheets

(51) Int. Cl.
  *G05B 19/418* (2006.01)
  *H03M 13/25* (2006.01)
  *H04L 29/06* (2006.01)
(52) U.S. Cl.
  CPC . *G05B 2219/25428* (2013.01); *H03M 13/256* (2013.01); *H04L 69/18* (2013.01)
(58) Field of Classification Search
  CPC ...... G05B 19/4185; G05B 2219/23276; G05B 2219/25248; G05B 19/0425; H03M 13/256
  See application file for complete search history.

(56) References Cited

U.S. PATENT DOCUMENTS

| | | | |
|---|---|---|---|
| 6,330,599 | B1 | 12/2001 | Harvey |
| 2003/0236937 | A1 | 12/2003 | Barros De Almeida et al. |
| 2010/0114334 | A1* | 5/2010 | Krumsiek ............ G05B 19/042 700/3 |
| 2011/0245932 | A1 | 10/2011 | Schleiss et al. |
| 2012/0254339 | A1* | 10/2012 | Holmes .............. G05B 19/4185 709/212 |
| 2015/0121507 | A1* | 4/2015 | Haija ........................ H04L 9/32 726/17 |
| 2015/0245220 | A1* | 8/2015 | Williamson ........... H04H 20/71 370/329 |
| 2017/0034308 | A1* | 2/2017 | Kande ..................... H04W 4/70 |
| 2017/0331929 | A1* | 11/2017 | Zielinski ................ H04L 69/18 |

OTHER PUBLICATIONS

"Written Opinion of the International Searching Authority (Form PCT/ISA/237) of PCT/JP2017/042214," dated Apr. 6, 2018, pp. 1-6.
"International Preliminary Report On Patentability (Form PCT/IPEA/409) of PCT/JP2017/042214," completed on Jun. 5, 2019, with English translation thereof, pp. 1-13.
Murrelektronik Gmbh, "Manual MVK Metall IO-Link," Jan. 2011, pp. 1-101.
"Office Action of China Counterpart Application" with English translation thereof, dated Aug. 17, 2021, p. 1-p. 22.

* cited by examiner

[Fig. 4]

METHOD AND CONTROL DEVICE FOR CONTROLLING A FIELD DEVICE

CROSS-REFERENCE TO RELATED APPLICATION

This application is a 371 of international application of PCT application serial no. PCT/JP2017/042214, filed on Nov. 24, 2017, which claims the priority benefit of Europe application no. 17157222.5, filed on Feb. 21, 2017. The entirety of each of the above-mentioned patent applications is hereby incorporated by reference herein and made a part of this specification.

TECHNICAL FIELD

The present invention relates to a method for controlling a field device, a computer program for controlling the field device, a control device for controlling the field device, and a technical system including the control device.

BACKGROUND ART

Nowadays, automation systems are widely used for industrial applications such as product manufacturing. Typically, different tools such as sensors, drills, or cutting tools may interchangeably be connected to a machine such as a robot or a robotic arm, and may be operated by a control device of the automation system via a control link Every time a new tool is selected and connected to the machine, parameters of the selected tool need to be communicated to the control device and a set-up of the control device needs to be performed in view of the selected tool. In particular, a machine application provided in an application layer of the control device and indicating information that is specific to each one of the different tools has to be adapted as a function of the selected tool. However, such a set-up of a connection between the control device and the new selected tool is time-consuming and error prone. It is further desirable to efficiently use only a limited number of physical interfaces, such as IO-Link pin plugs.

CITATION LIST

Non Patent Literature

The user manual "Manual MVK Metall IO-Link" by Murrelektronik GmbH, version 1.1 of 2011, describes a compact PROFIBUS module including a virtual head module, a digital input/output (DIO) module, and four IO-Link ports. The virtual head module is implemented on a PROFIBUS level, i.e. on a fieldbus level.

SUMMARY OF INVENTION

Technical Problem

It is one object of the present invention to provide an improved method for coupling a field device to a control device in an automation network.

As a secondary object, a method for controlling a field device, a computer program for controlling the field device, a control device for controlling the field device, and a technical system including the control device for automatically establishing a connection between a control device and a selected tool device coupled to the control device are desired without having to adapt the machine application in the application layer of the control device.

Solution to Problem

Accordingly, a method for controlling a field device coupled to an automation network is provided, and the field device has an associated tool device selected from a plurality of predetermined tool devices. The method includes the steps of:

coupling the selected tool device to a control device having a physical port device;

choosing a virtual link unit from a plurality of virtual link units included in the control device as a function of the selected tool device, in which each of the virtual link units corresponds to one of the predetermined tool devices; and establishing a control link between the chosen control device and the selected tool device being associated to the field device via the physical port device using control data included in the chosen virtual link unit.

The field device, the automation network, and the control device may be part of a technical system included in an automation system such as a factory automation system. Such a technical system may be used to manufacture a product such as a microchip or a car, or to analyze the properties of a product such as a biological sample or an integrated circuit. The technical system may include several field devices and control devices coupled according to a predetermined manner, and the technical system may additionally include various entities such as user interfaces or storage units. The automation network may include one or a plurality of fieldbuses, or communication links may be implemented via the industrial Ethernet such as the EtherCAT.

A virtual link unit can be considered as a pointer to a virtual link descriptor having control information used to establish a data link between the tool device and the control device.

In embodiments, the automation network is a sensor network.

In embodiments, the field device is a technical machine such as a robot or a robotic arm, to which any one of the tool devices of the plurality of tool devices may removably be coupled, i.e. attached, fixed or connected. The plurality of tool devices may include both actuators and sensors. Actuators may include devices for welding, drilling, cutting, heating, cooling, rotating, displacing, and the like. Sensors may include sensors for measuring a temperature, humidity, pressure, or displacement.

When one tool device is selected from the plurality of the tool devices by a user or using a workflow, the selected tool device is coupled, in particular connected to, the control device. In the following, the term "selected tool device" refers to the selected tool device that is coupled to the control device, unless specified otherwise. The control device may control the selected tool device to operate, that is, to perform a predetermined operation such as drilling, cutting, heating, etc.

The control device may be a part of the field device. In other embodiments, the selected tool device is coupled to the control device via the field device. Moreover, the selected tool device can be coupled to the control device through the physical port device of the control device. The coupling can be performed by means of a cable. For example, a connector attached to a cable connected to the tool device may be plugged into a pin of the physical port device. In embodiments, the physical port device is adapted to physically couple the tool device with the control device via a plug connector, in particular according to an IO-Link standard. IO-Link is based on the international norm IEC 61131 relating to programmable logic controllers (PLCs).

In other embodiments, the coupling between the control device and the selected tool device includes a wireless coupling such as WIFI/WLAN coupling. In this case, the physical port device may be a WIFI interface including an antenna for receiving and/or sending wireless signals from/to the field device and/or the selected tool device.

The control device may include several physical port devices, to each of which a tool device can be connected.

In embodiments, the plurality of virtual link units included in the control device are stored in the control device prior to providing a set of tool devices. In embodiments, there is provided exactly one virtual link unit for each tool device. In other embodiments, several tool devices may share a single virtual link unit, and/or some tool devices may not have a corresponding virtual link unit provided in the control device. Each virtual link unit preferably has the corresponding tool device mapped thereon.

Each virtual link unit includes control data, for example including virtual link unit identification data representing properties or attributes of the virtual link unit. The control data may be stored in a data storage unit in the control device. The control data, in particular, include data information indicating which tool device corresponds to the virtual link device. For example, the control data includes information such as the device ID or the serial number of the corresponding tool device. The control device may use the control data to determine, for example, choose which virtual link unit from the plurality of virtual link units corresponds to the selected tool device.

Moreover, the control device may use the control data of the chosen virtual link unit to establish a control link between the control device and the selected tool device. The control link may be established over the existing connection between the tool device and the control device, for example over the cable connecting the tool device to the physical port of the control device. In embodiments, an additional connection may be established or used between the control device and the selected tool device for the control link.

According to an embodiment of the method, when a tool device is selected and coupled to the control device, a control link is automatically established between the selected tool device and the control device. It is thus unnecessary to perform a set-up of the control device in view of the selected tool. Moreover, tool device application information that includes protocols to operate each tool device of the plurality of tool devices does not need to be adapted to the selected tool, thereby realizing a control device with an improved flexibility. An increased diversity of the tool devices that can be connected to the field device is also provided. The use of virtual link units allows an efficient coupling and operation of field devices that are functionalized by the respective selected tool device. In particular, one may dispense with a manual adaption of operating software on the application level.

A further advantage lies in that the control link is established very rapidly. Thus, when switching between several tool devices during a same process, the process is not or only very shortly interrupted, thereby reducing downtimes for tool device changeovers. In the case of a manufacturing process, this allows an improved production capacity.

According to an embodiment, the above described method is implemented according to an IO-Link standard.

The IO-Link standard here corresponds to the international standard IEC 61131-9. When the IO-Link standard is used to implement the above described method, the control device may correspond to an IO-Link master, and the tool devices each may include an IO-Link device, sometimes also called slave device. The IO-Link master and the IO-Link devices may communicate via IO-Link connections.

The IO-Link master is generally connected to the remaining entities of the automation system, such as other IO-Link masters and user interfaces, via the automation network.

The IO-Link master may include at least a physical layer, for example including the physical port device, and an application layer including tool device application information indicating protocols and how to operate the selected tool device.

According to a further embodiment, the plurality of virtual link units is implemented in a data link layer of the control device, for example, of an IO-Link master.

Implementing the above method according to the IO-Link standard is beneficial in that standardized wiring, connections, and interfaces can be used, thereby providing a universal industrial system.

According to a further embodiment, the above described method further includes at least one of the steps of:

at the control device, receiving a tool device parameter from the selected tool device coupled to the control device;

comparing the received tool device parameter to the control data included in each virtual link unit; and determining, from the plurality of virtual link units, the virtual link unit which corresponds to the selected tool device in accordance with a result of the step of comparing the received tool device parameter to the control data included in each virtual link unit.

The steps of receiving the tool device parameter, comparing the received tool device parameter to the control data, and determining the virtual link unit corresponding to the selected tool device may be included in the step of choosing a virtual link unit described further-above.

The tool device parameter may provide information about the tool device, in particular information for identifying the tool device. For example, the tool device parameter includes a device ID, a serial number, and/or a vendor ID of the tool device. The tool device parameter may be sent to the control device using a connection between the control device and the tool device coupled to the control device. In this case, the tool device parameter is received at the physical port device of the control device. The received tool device parameter is then transmitted to a section of the control device that is configured to perform operations on said received tool device parameter, for example, to a selector device associated with the control device.

The tool device parameter may then be compared to control data included in each virtual link unit. For example, if the ID of the selected tool device is received as a tool device parameter, it is compared to the device ID included in the control data of each virtual link unit. If the tool device parameter matches the control data of a given virtual link unit, it is determined that said given virtual link unit corresponds to the selected tool device. In this case, a match does not necessarily mean that the compared information must be exactly identical. In embodiments, a partial agreement of the compared information can be considered sufficient for identifying the device. For example, in a case where the compared device IDs are identical, but the serial numbers are different or only partially identical, a match may still be determined. The requirements that need to be satisfied to obtain a match between the tool device parameter and the control data can be adjusted by the user, for example.

The virtual link unit that is determined to correspond to the selected tool device may be selected as the chosen virtual link, and a control link may then be established between the control device and the selected tool device based on the chosen virtual link, as described above and below.

According to a further embodiment, the method further includes:

determining whether an existing virtual link unit corresponds to the selected tool device coupled to the control device or not; and generating a new virtual link unit corresponding to the selected tool device coupled to the control device if it is determined that there is no existing virtual link unit corresponding to the selected tool device coupled to the control device.

The control unit may determine that there is no existing virtual link unit corresponding to the selected tool device. The term "existing virtual link unit" here indicates a virtual link unit that exists, that is, is already provided or stored in the control device at the time when the selected tool device is coupled with the control device, or at the time when the comparison between the received tool parameter and the control data is performed.

For example, if the received tool parameter has been compared to the control data of all existing virtual link units without determining a match, the control unit determines that there is no existing virtual link unit corresponding to the selected tool device. In this case, an error notification may be generated and potentially given out to a user by means of a visual or sound notification, for example.

Additionally or alternatively, the control unit, in particular a virtual link generation unit of the control unit, may generate a new virtual link unit including control data corresponding to the selected tool device. The new virtual link unit may be generated by a virtual link unit generator of the control unit using a program for generating new virtual link units stored in data storage unit of the control unit in accordance with information about the selected tool device, which may be received from the selected tool device via the physical port, such as tool device parameter, and/or using application information of the control device.

The generated new virtual link unit may be stored in the control device together with the other (existing) virtual link units, for example in the data storage unit, so as to be retrievable when the tool device corresponding to the new virtual link unit is selected and coupled to the control device again. After generating the new virtual link device, the control device may establish the control link between the control device and the selected tool device using the control data included in the new virtual link device.

In embodiments, the control device automatically generates new virtual link unit if an unknown tool device is detected, without requiring the user to provide or generate the new virtual link unit. The diversity or amount of the tool devices that can be associated to the field device and controlled by the control device is thereby increased.

According to a further embodiment, the method further includes generating status data indicating whether the control link has successfully been established between the control device and the selected tool device coupled to the control device or not.

The status data may be generated by a status generator in the control device. The generated status data may be stored in the control device, for example in the data storage unit, and/or may be output to the user or to other units of the technical system. For example, a visual or sound signal may be output to the user. An effort for troubleshooting can thereby be reduced.

Alternatively, the generated status data may be sent to another control device of the technical system via the automation network to indicate that a predetermined process should be interrupted or initiated. Therefore, failures of the technical system can be prevented because misconnections, that is, non-establishment of the control link of the selected tool device to the control device can be recognized.

According to a further embodiment, the method further includes storing the control data in a data storage unit of the control device.

According to a further embodiment, the physical port device is implemented to connect to only one tool device at a time. For example, the physical port device is a pin-plug connection.

In particular, only one control link may be established at a time via one physical port device in specific embodiments. Thus, even if several tool devices are connected to the field device at once, only one tool device (the selected tool device) is connected to the control device via the control link.

According to a further embodiment, the method further includes controlling, by means of the control device, an operation of the selected tool device coupled to the control device using the established control link.

For example, the control device may control the operation such as drilling, cutting, or rotating of the selected tool device using the established control link. In particular, to control such operations, the control device may use the pre-stored application information indicating protocols and how to operate the selected tool device. The application information may include information that is specific to the selected tool device, such as a required operation time of the selected tool device, the depth of a drill, or the length of a cut.

According to a further embodiment, the control data includes virtual link unit identification data including at least one of a vendor ID, a unit ID, a serial number, or a description of the virtual link unit.

According to a further embodiment, the control data includes data for controlling the operation of the tool device associated to the virtual link unit. For example, the control data includes information to perform operations such as drilling, cutting, or rotating of the selected tool device.

According to a further embodiment, a computer program product including a program code for executing the program for operating the above method is provided, in particular when run on at least one computer.

A computer program product, such as a computer program means, may be embodied as a memory card, USB stick, CD-ROM, DVD, or as a file which may be downloaded from a server in a network. For example, such a file may be provided by transferring the file including the computer program product from a wireless communication network.

According to a further embodiment, a control device for controlling a field device coupled to an automation network is provided, in which the field device has an associated tool device selected from a plurality of predetermined tool devices. The control device includes a physical port device for connecting at least the selected tool device to the control device; and a plurality of virtual link units, in which each virtual link unit corresponds to one of the predetermined tool devices and includes control data for establishing a control link between the control device and the selected tool device being associated to the field device via the physical port device.

According to a further embodiment, the control device is implemented to execute the method described above or below.

According to a further embodiment, the control device further includes a selector for comparing a tool device parameter received from the selected tool device coupled to the control device to the control data included in each virtual link unit, and for determining, from the plurality of virtual link units, the virtual link unit which corresponds to the selected tool device, in accordance with a result of comparison of the received tool device parameter to the control data included in each virtual link unit.

According to a further embodiment, the selector is further configured to determine whether an existing virtual link unit corresponds to the selected tool device coupled to the control device or not, and in which the control device further includes a virtual link unit generator for generating a new virtual link unit corresponding to the selected tool device coupled to the control device if the selector determines that there is no existing virtual link unit corresponding to the selected tool device coupled to the control device.

According to a further embodiment, the control device further includes a status generator for generating status data indicating whether the control link has successfully been established between the control device and the selected tool device coupled to the control device or not.

According to a further embodiment, the control device further includes a data storage unit for storing the control data.

According to a further embodiment, the control device further includes a controller for controlling the operation of the selected tool device coupled to the control device using the established control link.

According to a further embodiment, a technical system including the control device described above and a selected tool device connected to the control device via the physical port device is provided.

The embodiments and features described with reference to the method of the present invention apply mutatis mutandis to the computer program product, the control device and the technical system as disclosed.

Further possible implementations or alternative solutions of the invention also encompass combinations—that are not explicitly mentioned herein—of features described above or below with regard to the embodiments. The person skilled in the art may also add individual or isolated aspects and features to the most basic form of the invention.

Further embodiments, features and advantages of the present invention will become apparent from the subsequent description and dependent claims, taken in conjunction with the accompanying drawings, in which:

BRIEF DESCRIPTION OF DRAWINGS

In the Figures, like reference numerals designate like or functionally equivalent elements, unless otherwise indicated.

DESCRIPTION OF EMBODIMENTS

Figure 1:
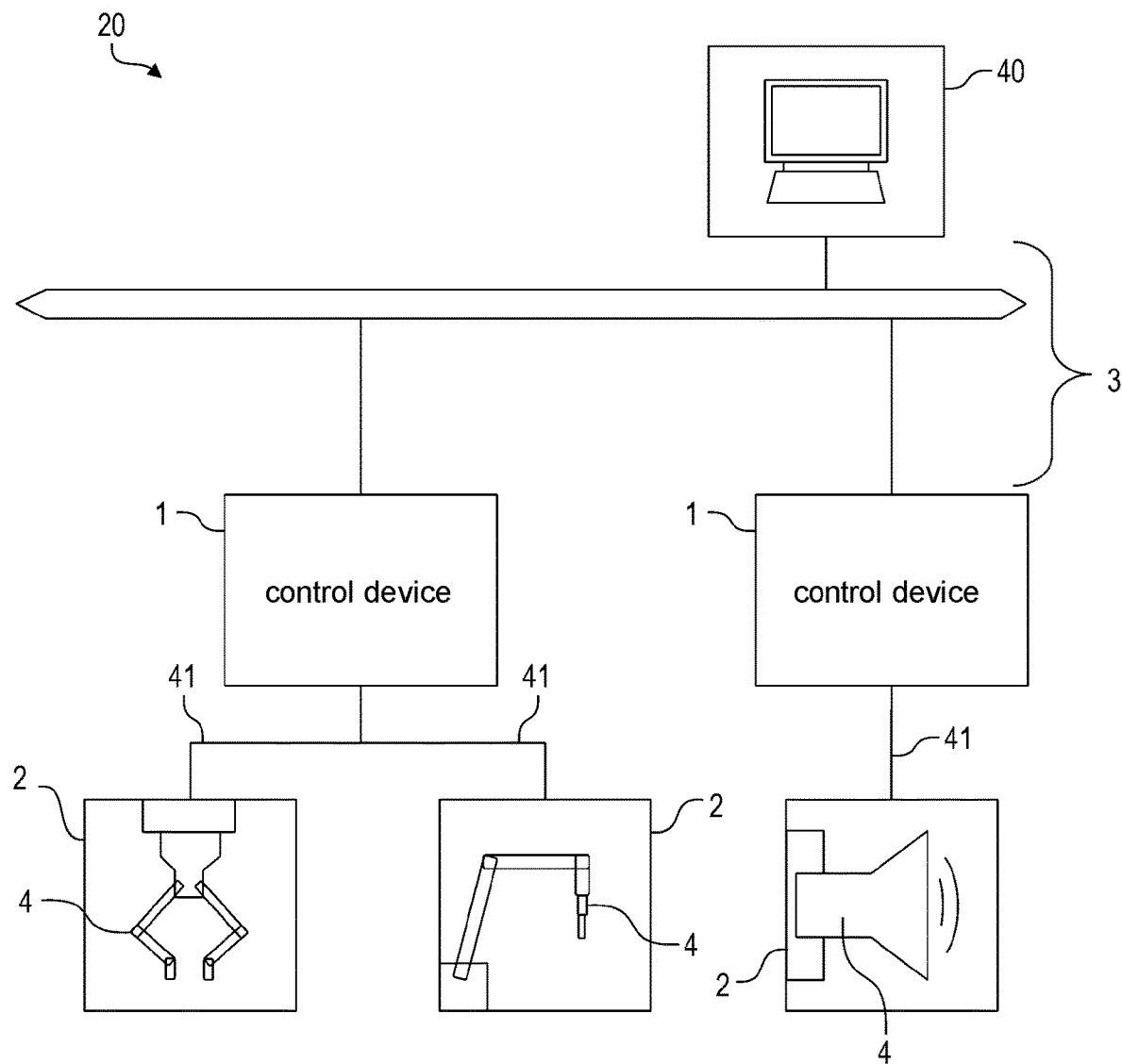
FIG. 1 shows a first embodiment of a technical system.

FIG. 1 shows technical system 20 according to a first embodiment that is suitable for executing a control method explained below. The technical system 20 includes two control devices 1 configured as IO-Link masters, which are coupled to an automation network 3, which is a fieldbus. A user interface 40, here a personal computer, may communicate with the control devices 1 via the network 3. The control devices 1 are connected to field devices 2 by means of cables 41. Two of the field devices 2 are connected to a same left control device 1, while only one field device 2 is connected to a right control device 1. Each field device 2 has a selected tool device 4 connected thereto. The tool devices 4 are implemented as IO-Link devices. The illustrated field devices 2 holding respective tool devices 4 are, from left to right, a support holding a ply 4, a robotic arm holding a drill 4, and a support holding a loudspeaker 4.

The layout of the technical system 20 may be modified as desired, for example by the addition or deletion of control devices 1, user interfaces 40, field devices 2, or tool devices 4. Instead of the cables 41, wireless communications may be set up between the field devices 2 and the control devices 1. Moreover, any sensors or actuators may be used as the tool devices 4.

Figure 5:
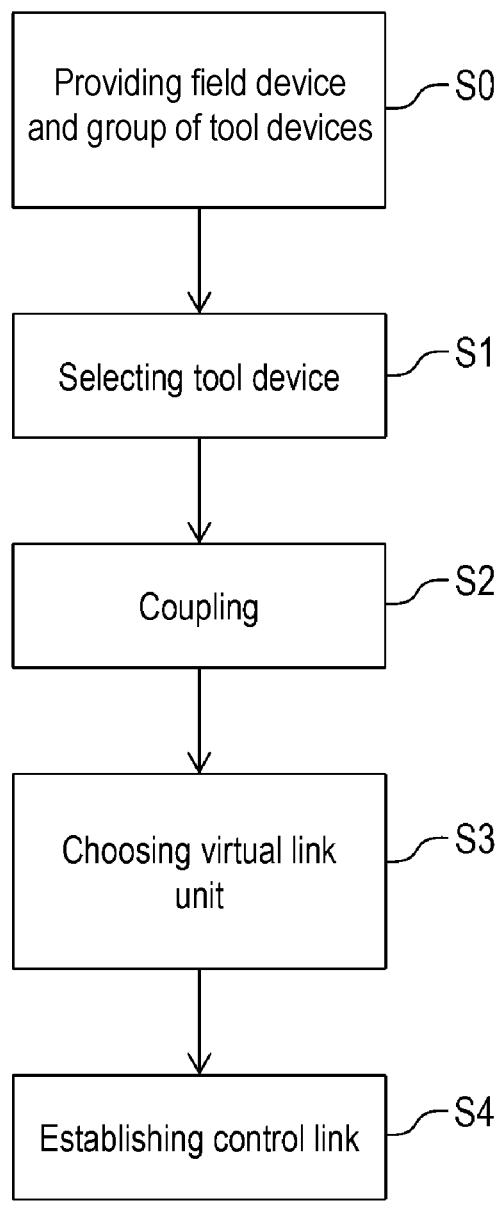
FIG. 5 shows a flowchart of a first embodiment of a method for controlling a field device.
Figure 6:
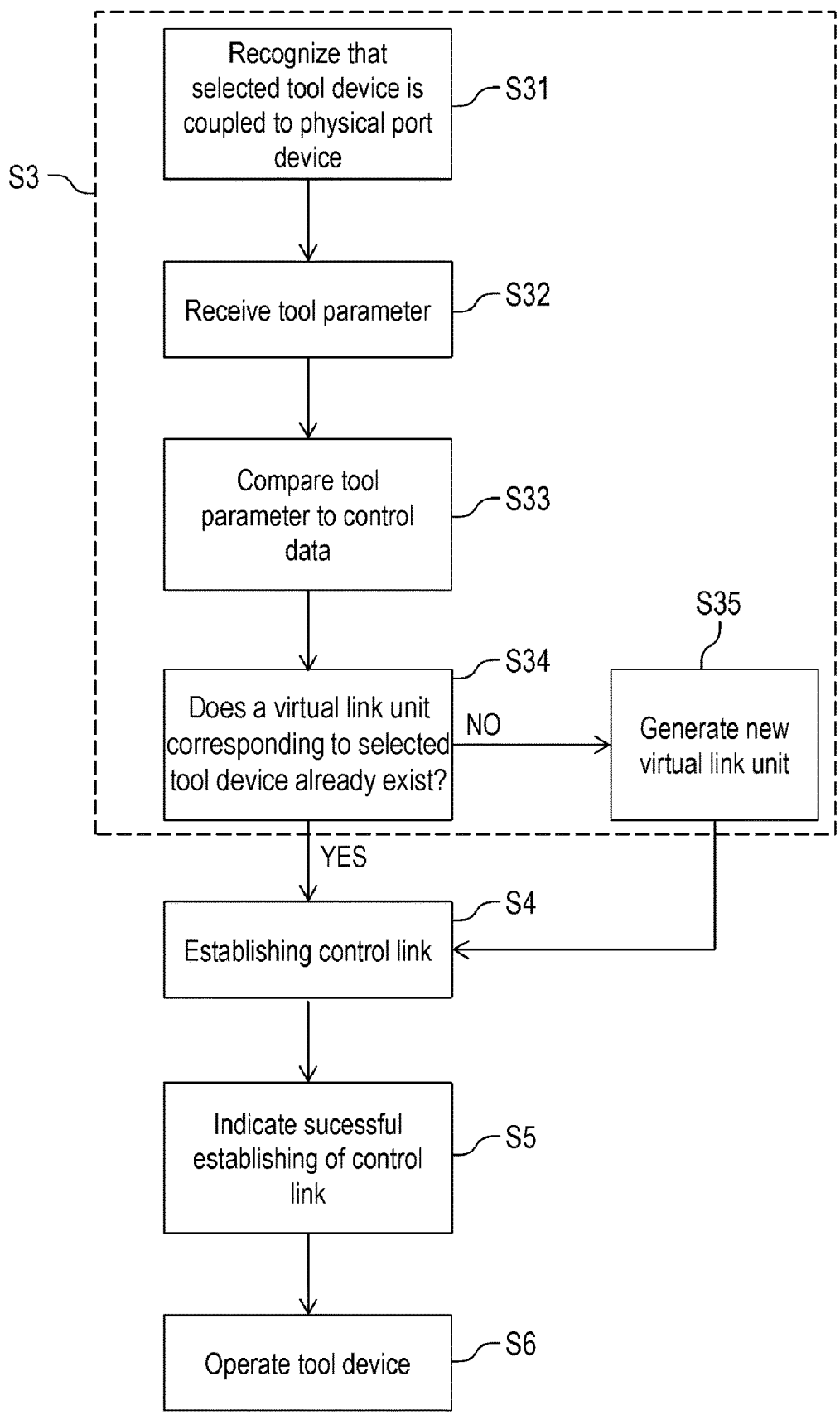
FIG. 6 shows a flowchart of a second embodiment of a method for controlling a field device.

When operating the technical system 20, for example, as an industrial automation network according to an IO-Link standard, the selected tool devices 4 are controlled via respective control links established by use of a virtual link unit in the control device 1. The virtual link unit may be understood as a descriptor file with control information used to communicatively couple specific tools 4 with the automation network via the assigned control device 1. The virtual link units are implemented on a data link layer level according to the OSI layer model. FIGS. 5 and 6 below provide more detailed flowcharts for explaining embodiments of respective control methods.

Figure 2:
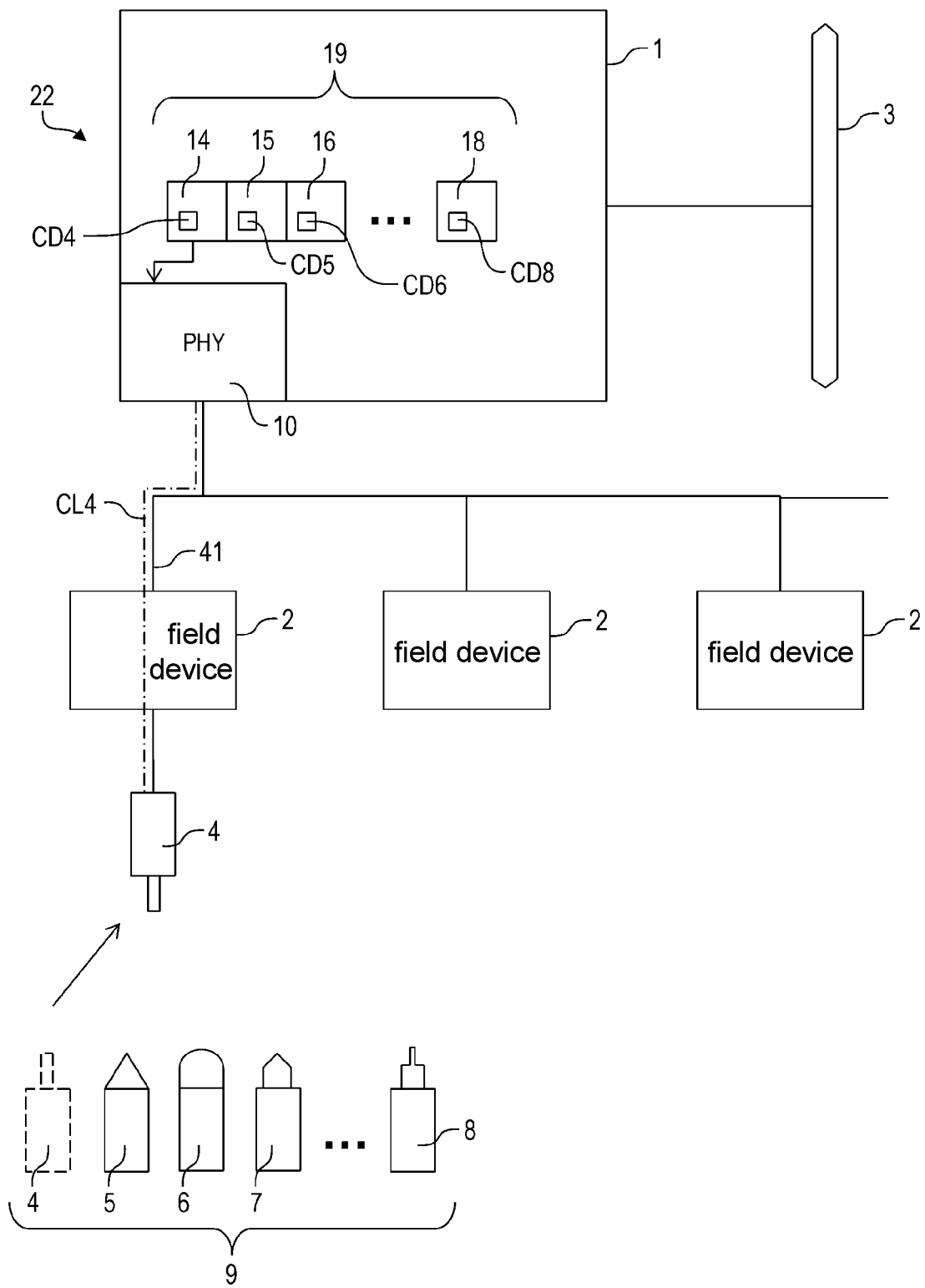
FIG. 2 shows a second embodiment of a technical system.

FIG. 2 shows a detailed representation of the technical system 22, for example, an industrial automation network according to a second embodiment. The technical system 22 differs from the technical system 20 in that three field devices 2 are connected to the same control device 1. The control devices are, for example, master IO-Link devices. A group 9 of tool devices 4-8, here cutting tools having different blade shapes, is provided. Each of the tool devices 4-8 may be connected to at least the left field device 2. In other words, each of the tool devices 4-8 may be selected and associated to the left field device 2. The tool device 4 is selected from the group 9 of tool devices 4-8 and connected to the field device 2. In detail, the selected tool device 4 is connected to a physical port device (PHY) 10 of the control device 1 by means of the cable 41.

The control device 1 includes a group 19 of virtual link units 14-18, here virtual IO-Link units, which respectively correspond to the tool devices 4-8 of the group 9 of tool devices 4-8. Each virtual link unit 14-18 includes control data CD4-CD8 including at least device ID information of the tool device 4-8 corresponding to the respective virtual link unit 14-18. The one skilled in the art may also contemplate the virtual link units 14-18 as descriptor files holding the control data and/or pointers to such descriptor files. The control device 1 chooses the virtual link unit 14 corresponding to the selected tool device 4, for example by determining that the device ID information of the virtual link unit 14 matches a device ID information of the selected tool device 4. A control link CL4 is established via the cable 41 between the chosen control device 1 and the selected tool device 4. The control link CL4 is indicated by the dash-dotted line in the figure.

Figure 3:
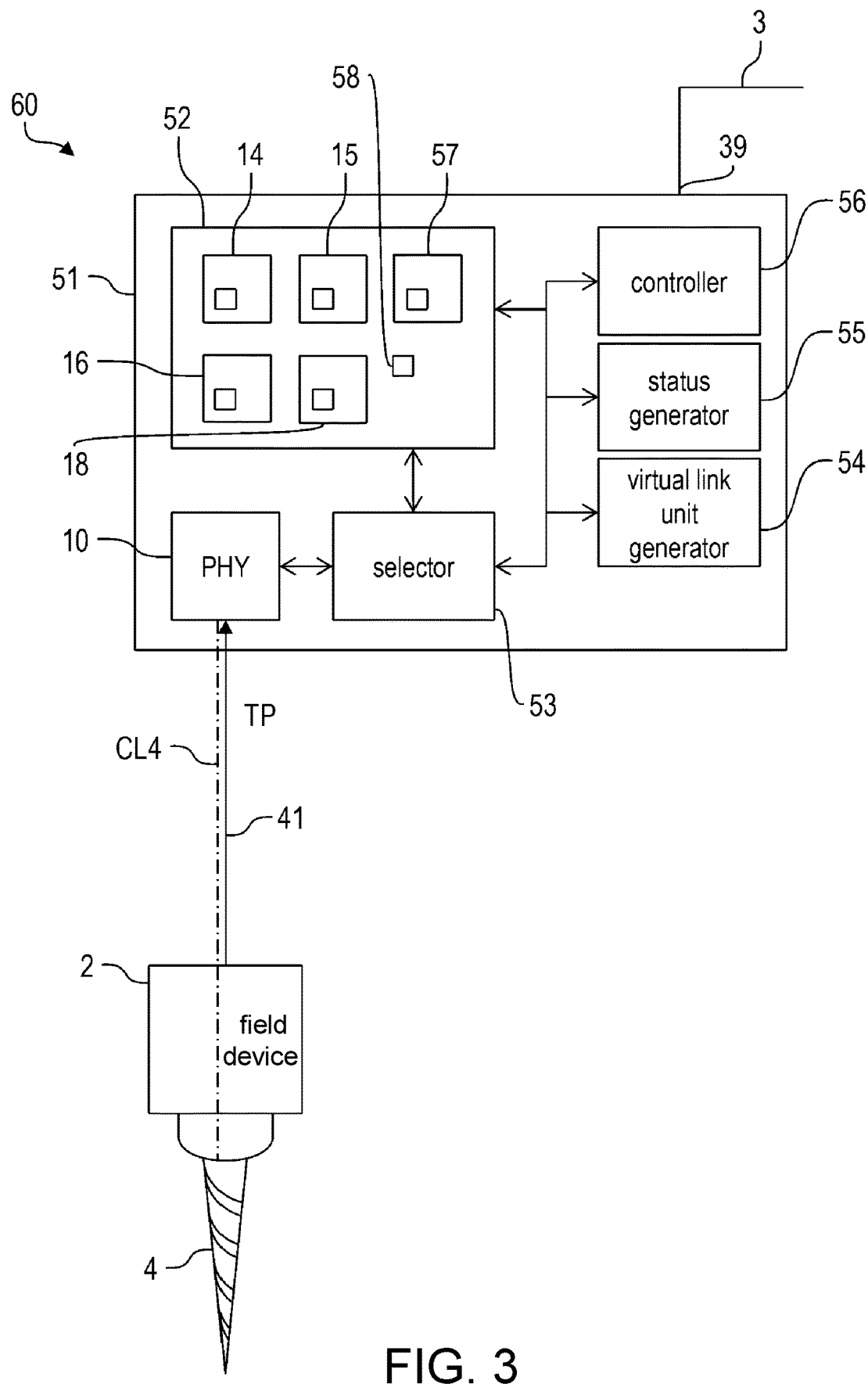
FIG. 3 shows a third embodiment of a technical system.

FIG. 3 shows a third embodiment of a technical system 60. The technical system 60 has a similar configuration as the systems 20 and 22 of FIGS. 1 and 2. The technical system 60 includes a control device 51 with a physical port device 10 for coupling external devices such as field and/or tool devices to an automation network via network interface 39. The control device 51 of the third embodiment includes a storage device 52 for storing virtual link units 14, 15, 16, 18, 57, and/or descriptor data 58 corresponding to a respective virtual link unit. The control device 51 further includes a controller 56, a status generator 55, a virtual link unit generator 54, and a selector 53. The elements 53-56 may be implemented as hardware or software elements. For example, selector 53 may be implemented as a software routine or function for selecting an appropriate virtual link unit. The control device 51 is in particular adapted to execute an embodiment of a control method described below with respect to FIGS. 5 and 6.

When the selected tool device 4, here a drill, is coupled to the physical port 10 of the control device 51, the selected tool device 4 sends a tool device parameter TP being the device ID information of the selected tool device 4 to the control device 51 via the cable 41. Hence, a data set including the ID information is generated and transmitted over the physical port 10. The control device 51 receives the tool device ID information TP of the selected tool device 4 via the physical port 10, and transmits the received tool device ID information TP to the selector 53. The selector 53 retrieves device ID information included in the control data CD4-CD8 from the virtual link units 14-18 saved in a data storage unit 52 of the control device 51.

Then, the selector 53 compares the received tool device ID information TP with the device ID information provided in the control data CD4-CD8. The selector 53 determines that the received tool device ID matches, that is, is identical to the device ID information provided in the control data CD4 of the virtual link unit 14. The selector 53 thereby determines that the virtual link unit 14 corresponds to the selected tool device 4 coupled to the control device 51. The control link CL4 is then established between the physical port device 10 and the tool device 4.

A controller 56 included in the control device 51 controls an operation of the tool device 4 using the established control link CL4. The control of the selected tool device 4 performed by the controller 56 is performed in accordance with an application information 58 which is pre-stored in the data storage unit 52 and which indicates protocols for operating the selected tool device 4. For example, the application information 58 indicates that the selected tool device 4, which is a drill, should be operated for 10 seconds at a speed of 1200 RPM (revolutions per minute).

The control device 51 further includes a status generator 55 for generating status data indicating whether the control link CL4 has successfully been established or not. Here, the control link CL4 has successfully been established and the generated status data, which indicates a successful connection, is sent to the user via the fieldbus 3 and is displayed on a screen of the personal computer 40 (not shown). Alternatively or additionally, the generated status data is stored in the data storage unit 52.

The control device 51 further includes a virtual link unit generator 54 for generating a new virtual link unit 57 to be stored in the data storage unit 52 when the selector 53 determines that there is no existing virtual link unit 14-18 corresponding to the selected tool device.

Figure 4:
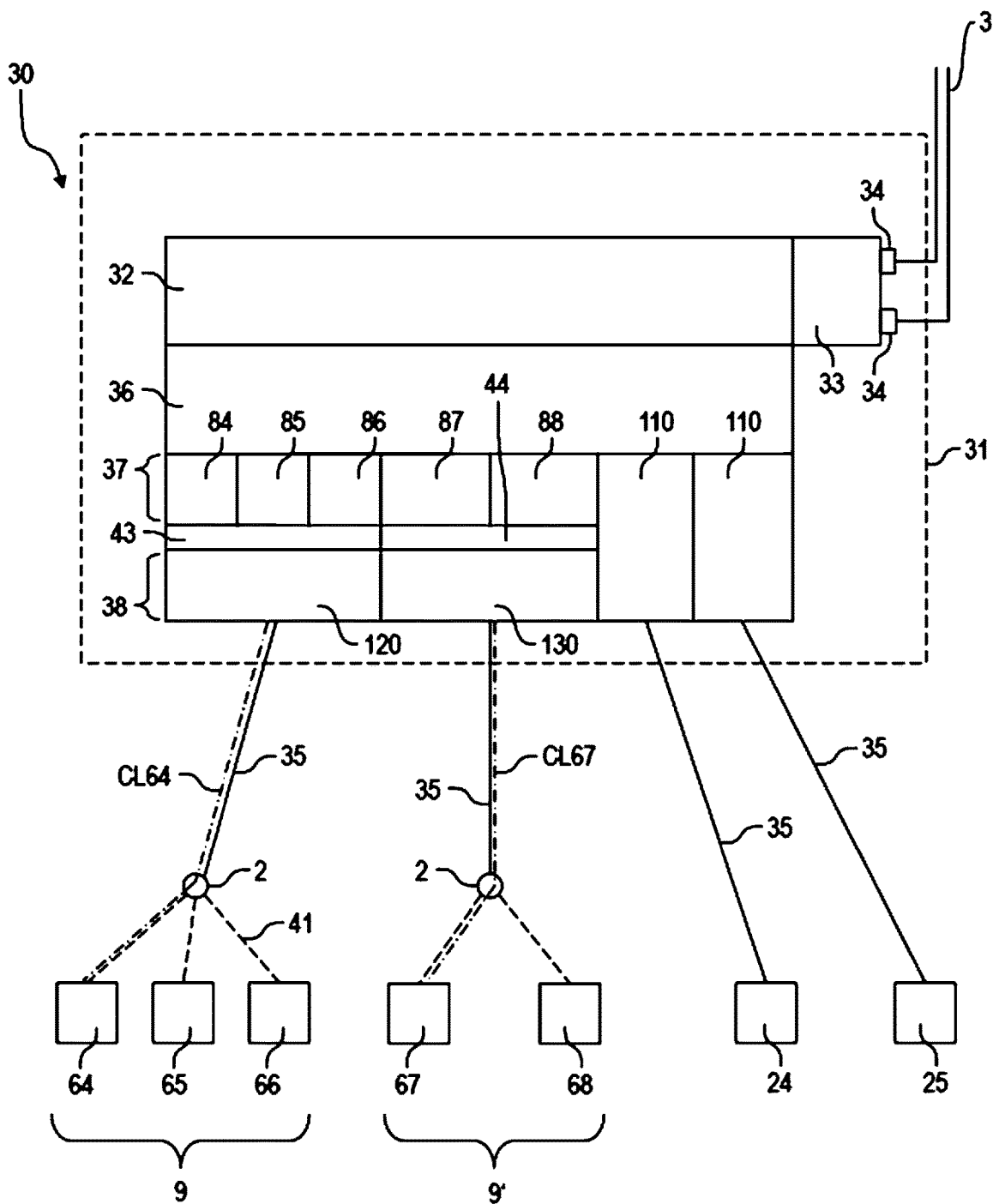
FIG. 4 shows a fourth embodiment of a technical system.

FIG. 4 shows a technical system 30 according to a fourth embodiment. The technical system 30 is an IO-Link system corresponding to the international standard IEC 61131-9. The control unit 31 is an IO-Link master connected to field devices 2 and to IO-Link devices 24, 25 by means of IO-Links 35.

The right part of the IO-Link master 31 corresponds to conventional physical port devices 110 to which only one IO-Link device 24, 25 may respectively be connected. In other words, the IO-Link devices 24, 25 are not interchangeable. In this case, no virtual link units corresponding to the tool devices 24, 25 are provided for the ports 110. When the IO-Link devices 24, 25 are coupled to their respective physical port devices 110, 110, the IO-Link master device 31 knows which IO-Link devices 24, 25 has been coupled thereto and a connection is automatically established between the respective IO-Link devices 24, 25 and the IO-Link master device 31, without the need of a selector or virtual IO-Link devices. Changing the tool devices 24 or 25, however, involves changes on an application level in the automation network to adapt the control process to the altered functions of the tool devices 24, 25.

A leftmost physical port device 120 and a middle physical port device 130 form a physical layer 38 of the IO-Link master 31. Three IO-Link devices 64-66 are provided as a first toolset forming a first group 9 of IO-Link devices, and are all configured to be coupled to the physical port device 120. The IO-Link device 64 is coupled to the IO-Link master 31 via the physical port device 120, and a control link CL64 is established therebetween. The control link CL64 is established in the same or similar manner as the control link CL4 in FIGS. 2 and 3. The IO-Link devices 65 and 66 here are not coupled to the IO-Link master 31, but they may be optionally coupled to the IO-Link master 31 instead of the IO-Link device 64.

Similarly, two IO-Link devices 67, 68 (group 9') are provided as a second toolset forming a second plurality of IO-Link devices and are all configured to be coupled to the physical port device 130. The IO-Link devices 67 is coupled to the IO-Link master 31 via the physical port device 130, and a control link CL67 is established therebetween in the same manner as the control link CL64. The IO-Link device 68 is not connected to the control device 31, but it may be coupled to the IO-Link master 31 instead of the IO-Link device 67.

The layer above the physical layer 38 includes the selectors 43 and 44 which have the same functionality as the selector 53 described in view of FIG. 3. The selector 43 is connected to the physical port device 120 and to three virtual IO-Link units 84-86 corresponding to the IO-Link devices 64-66 that can be coupled to the IO-Link master 31 via the physical port device 120. The selector 43 selects, from the three virtual IO-Link units 84-86, the virtual IO-Link unit 84 corresponding to the selected IO-Link device 64. A control link CL64 is established between the selected IO-Link device 64 and the control device 31. In the control device 31, elements are communicatively coupled to one other via an internal bus, for example.

Similarly, the selector 44 is connected to the physical port device 130 and to two virtual IO-Link units 87, 88 corresponding to the IO-Link devices 67, 68 that may be coupled to the IO-Link master 31 through the physical port device 130. The selector 44 selects, from the two virtual IO-Link units 87, 88, the virtual IO-Link unit 87 corresponding to the selected IO-Link device 67. A control link CL67 is established between the selected IO-Link device 67 and the control device 31.

The virtual link units 84-88 corresponding to the respective IO-Link devices 64-68 are provided in a data link layer 37 located above the selectors 53. The IO-Link master 31 further includes an IO-Link master driver 36 and an application layer 32 in which application information is stored.

Moreover, the IO-Link master 31 includes an EtherCAT driver 33 and EtherCAT physical ports 34 for communicating with external devices via the EtherCAT forming the automation network 3.

FIG. 5 shows a flowchart of a first embodiment of a method of controlling and/or operating a field device 2. The control devices 1, 31, 51 described in view of FIGS. 1 to 4 may be implemented to execute the method of controlling a field device 2 according to the described embodiment of a control method.

In a first preparation step S0, the field device 2 and the group 9 of tool devices 4-8, 64-68 are provided. In step S1, one tool device 4, 64, 67 is selected from the group 9 of tool devices 4-8, 64-68. The selected tool device is coupled to the physical port 10, 120, 130 of the control device 1, 31, 51 in step S2. Then, in step S3, the control device 1, 31, 51 chooses the virtual link unit 14, 64, 67 from the plurality of virtual link units 14-18, 64-68 which corresponds to the selected tool device 4, 64, 67. In step S4, the control device 1, 31, 51 establishes the control link CL4, CL64, CL67 between the selected tool device 4, 64, 67 and the control device 1, 31, 51.

FIG. 6 shows a more detailed flowchart of a method of controlling a field device 2 according to a second embodiment. In detail, FIG. 6 shows the process steps performed by the control device 51 and/or 31 of FIGS. 3 and 4, respectively, in detail. In FIG. 6, the steps S31-S35 correspond to the step S3 shown in FIG. 5.

In step S31, the control device 51, 31 recognizes that the selected tool device 4 is coupled to the physical port device 10 of the control device 51. Then, in step S32, the control device 51 receives, via the physical port device 10, the tool parameter TP, such as the ID information of the selected tool device 4 from the selected tool device 4. The selector 53 compares the ID information of the selected tool device 4 with ID information included in the control data CD4-CD8 of each virtual link unit 14-18 in step S33. If the selector 53 finds that one of the virtual link units 14-18 corresponds to the selected tool device 4, that is, there is a match between the ID information of the selected tool device 4 and an ID information of one of the virtual link unit 14-18 (step S34: YES), the process continues with step S4, in which the control link CL4 is established between the control device 51 and the selected tool device 4. Once the control link CL4 is successfully established, the status generator 55 generates a status indicating successful establishment of the control link in step S5. Finally, in step S6, the controller 56 of the control device 51 controls the operation of the selected tool device 4 via the established control link.

Although the present invention has been described in accordance with preferred embodiments, it is obvious for the one skilled in the art that modifications are possible in all embodiments.

Aspects of the present disclosure are described above with reference to flowchart illustrations and/or block diagrams of methods, apparatus (systems) and computer program products according to embodiments of a technical system, a control device and/or a control method for an automation network. It will be understood that each block of the flowchart illustrations and/or block diagrams may be implemented by one or more computer program instructions. These computer program instructions may be provided to a processor of a general-purpose computer, special purpose computer, or other programmable data processing apparatus to produce a machine, such that the instructions, which is executed via the processor of the computer or other programmable data processing apparatus, create means for implementing the functions/acts specified in the flowchart and/or block diagram block or blocks.

The invention claimed is:

1. A method for controlling a field device coupled to an automation network, the field device having an associated tool device selected from a group of predetermined tool devices, the method comprising the steps of:
   coupling the selected tool device to a control device having a physical port device;
   choosing a virtual link unit from a group of virtual link units included in the control device as a function of the selected tool device, wherein each of the virtual link unit corresponds to one of the predetermined tool devices; and
   establishing a control link between the control device coupled to the selected tool device, and the selected tool device being associated to the field device via the physical port device using control data included in the chosen virtual link unit.

2. The method according to claim 1, wherein the method is implemented according to an IO-Link standard.

3. The method according to claim 1, wherein the group of virtual link units is provided in a data link layer of the control device.

4. The method according to claim 1, further comprising:
   at the control device, receiving a tool device parameter from the selected tool device coupled to the control device;
   comparing the received tool device parameter with the control data included in each of the virtual link units; and
   determining, from the group of virtual link units, the virtual link unit which corresponds to the selected tool device, in accordance with a result of the step of comparing the received tool device parameter with the control data included in each of the virtual link units.

5. The method according to claim 1, further comprising:
   determining whether an existing virtual link unit corresponds to the selected tool device coupled to the control device or not; and
   generating a new virtual link unit corresponding to the selected tool device coupled to the control device if it is determined that there is no existing virtual link unit corresponding to the selected tool device coupled to the control device.

6. The method according to claim 1, further comprising generating status data indicating whether the control link has successfully been established between the control device and the selected tool device coupled to the control device or not.

7. The method according to claim 1, further comprising:
   storing the control data in a data storage unit of the control device.

8. The method according to claim 1, wherein the physical port device is implemented to connect to only one tool device at a time.

9. The method according to claim 1, further comprising: controlling, by means of the control device, an operation of the selected tool device coupled to the control device using the established control link.

10. The method according to claim 1, wherein the control data includes virtual link unit identification data including at least one of a vendor ID, a unit ID, a serial number, or a description of the virtual link unit.

11. The method according to claim 1, wherein the control data includes data for controlling the operation of the tool device associated to the virtual link unit.

12. A non-transitory recording medium storing a program code adapted to perform the method of claim 1.

13. A control device for controlling a field device coupled to an automation network, the field device having an associated tool device selected from a group of predetermined tool devices, the control device comprising:
- a physical port device for connecting at least the selected tool device to the control device; and
- a group of virtual link units, wherein each of the virtual link units corresponds to one of the predetermined tool devices and includes control data for establishing a control link between the control device and the selected tool device being associated to the field device via the physical port device.

14. The control device according to claim 13, wherein the control device is configured to execute a method comprising the steps of:
- coupling the selected tool device to the control device having the physical port device;
- choosing a virtual link unit from a group of virtual link units included in the control device as a function of the selected tool device, wherein each of the virtual link unit corresponds to one of the predetermined tool devices; and
- establishing the control link between the control device coupled to the selected tool device, and the selected tool device being associated to the field device via the physical port device using control data included in the chosen virtual link unit.

15. A technical system comprising the control device according to claim 14, and the selected tool device connected to the control device via the physical port device.

16. A technical system comprising the control device according to claim 13, and the selected tool device connected to the control device via the physical port device.

* * * * *